United States Patent
Kasztenny et al.

(10) Patent No.: US 10,641,815 B2
(45) Date of Patent: May 5, 2020

(54) SECURE DISTANCE PROTECTION OF ELECTRIC POWER DELIVERY SYSTEMS UNDER TRANSIENT CONDITIONS

(71) Applicant: Schweitzer Engineering Laboratories, Inc., Pullman, WA (US)

(72) Inventors: Bogdan Z. Kasztenny, Markham (CA); Chadburn Troy Daniels, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 118 days.

(21) Appl. No.: 16/143,668

(22) Filed: Sep. 27, 2018

(65) Prior Publication Data

US 2020/0103455 A1    Apr. 2, 2020

(51) Int. Cl.
*G01R 31/08* (2020.01)
*G01R 31/28* (2006.01)
(Continued)

(52) U.S. Cl.
CPC ....... *G01R 31/085* (2013.01); *G01R 31/2836* (2013.01); *H02H 3/042* (2013.01);
(Continued)

(58) Field of Classification Search
CPC ...... G01R 31/00; G01R 31/08; G01R 31/081; G01R 31/085; G01R 31/10; G01R 31/28; G01R 31/2831; G01R 31/2836; G01R 31/52; G01R 31/54–56; G01R 27/00; G01R 27/02; G01R 27/16; G01R 27/18; H02H 7/00; H02H 7/20; H02H 3/00; H02H 3/02; H02H 3/04; H02H 3/042;
(Continued)

(56) References Cited

U.S. PATENT DOCUMENTS 3,585,298 A   6/1971   Liberman
3,670,240 A   6/1972   Maranchak
(Continued)

FOREIGN PATENT DOCUMENTS

EP    226210    12/1986
EP    241832    7/1990
(Continued)

OTHER PUBLICATIONS

Harshad Mehta, Fault Location Techniques for High-Voltage DC Lines, EPRI EL-4331 Project 2150-1, 1985.
(Continued)

*Primary Examiner* — Hoai-an D. Nguyen
(74) *Attorney, Agent, or Firm* — Richard M. Edge

(57) ABSTRACT

A secure distance protection for electric power delivery systems under transient conditions is disclosed herein. Upon detection of a transient condition, additional security is added to a distance protection element before a protective action is taken. The transient condition may be detected when an angle of advancement of an operating signal is outside of a predetermined threshold. An unsecure condition may also be detected before applying additional security. The unsecure condition may be detected based on an estimation of a fault within a close-in zone and a voltage magnitude falling below a threshold.

20 Claims, 12 Drawing Sheets

(51) Int. Cl.
  *H02H 7/20* (2006.01)
  *H02H 3/04* (2006.01)
  *H04L 12/24* (2006.01)
  *H02H 3/10* (2006.01)
  *G01R 27/18* (2006.01)
  *H02H 3/16* (2006.01)

(52) U.S. Cl.
  CPC ........... *H02H 7/20* (2013.01); *H04L 41/0677* (2013.01); *G01R 27/18* (2013.01); *H02H 3/10* (2013.01); *H02H 3/16* (2013.01); *H04L 41/06* (2013.01)

(58) Field of Classification Search
  CPC ............ H02H 3/105; H02H 3/16; H02H 1/00; H02H 1/0007; H02H 1/0015; H04L 41/00; H04L 41/06; H04L 41/0677
  USPC ....... 324/500, 509, 512, 527, 528, 531, 555, 324/336, 76.11, 102; 702/1, 57–59, 127, 702/182, 183, 185; 361/1, 42; 340/1.1, 340/3.1, 3.43, 3.44
  See application file for complete search history.

(56) References Cited

U.S. PATENT DOCUMENTS

| | | |
|---|---|---|
| 3,878,460 A | 4/1975 | Nimmersjö |
| 3,890,544 A | 6/1975 | Chamia |
| 3,956,671 A | 5/1976 | Nimmersjö |
| 4,053,816 A | 10/1977 | Nimmersjö |
| 4,063,162 A | 12/1977 | Lanz |
| 4,063,164 A | 12/1977 | Lanz |
| 4,063,165 A | 12/1977 | Lanz |
| 4,165,482 A | 8/1979 | Gale |
| 4,183,072 A | 1/1980 | Takagi |
| 4,251,770 A | 2/1981 | Schweitzer, Jr. |
| 4,254,444 A | 3/1981 | Eriksson |
| 4,296,452 A | 10/1981 | Eriksson |
| 4,342,064 A | 7/1982 | Wilkinson |
| 4,344,142 A | 8/1982 | Diehr |
| 4,351,011 A | 9/1982 | Liberman |
| 4,371,907 A | 2/1983 | Bignell |
| 4,377,834 A | 3/1983 | Eriksson |
| 4,438,475 A | 3/1984 | Haley |
| 4,475,079 A | 10/1984 | Gale |
| 4,499,417 A | 2/1985 | Wright |
| 4,500,834 A | 2/1985 | Ko |
| 4,626,772 A | 12/1986 | Michel |
| 4,766,549 A | 8/1988 | Schweitzer |
| 4,797,805 A | 1/1989 | Nimmersjö |
| 4,800,509 A | 1/1989 | Nimmersjö |
| 4,825,326 A | 4/1989 | Andow |
| 5,083,086 A | 1/1992 | Steiner |
| 5,140,492 A | 8/1992 | Schweitzer, III |
| 5,198,746 A | 3/1993 | Gyugyi |
| 5,367,426 A | 11/1994 | Schweitzer, III |
| 5,446,387 A | 8/1995 | Eriksson |
| 5,481,195 A | 1/1996 | Meyer |
| 5,515,227 A | 5/1996 | Roberts |
| 5,572,138 A | 11/1996 | Nimmersjö |
| 5,682,100 A | 10/1997 | Rossi |
| 5,703,745 A | 12/1997 | Roberts |
| 5,729,144 A | 3/1998 | Cummins |
| 5,796,258 A | 8/1998 | Yang |
| 6,222,711 B1 | 4/2001 | Hori |
| 6,239,959 B1 | 5/2001 | Alexander |
| 6,341,055 B1 | 1/2002 | Guzman-Casillas |
| 6,417,791 B1 | 7/2002 | Benmouyal |
| 6,420,875 B1 | 7/2002 | Kasztenny |
| 6,434,715 B1 | 8/2002 | Andersen |
| 6,477,475 B1 | 11/2002 | Takaoka |
| 6,525,543 B1 | 2/2003 | Roberts |
| 6,597,180 B1 | 7/2003 | Takaoka |
| 6,601,001 B1 | 7/2003 | Moore |
| 6,662,124 B2 | 12/2003 | Schweitzer, III |
| 6,798,211 B1 | 9/2004 | Rockwell |
| 6,845,333 B2 | 1/2005 | Anderson |
| 6,944,554 B2 | 9/2005 | Kim |
| 7,119,546 B2 | 10/2006 | Cautereels |
| 7,174,261 B2 | 2/2007 | Gunn |
| 7,345,862 B2 | 3/2008 | Schweitzer, III |
| 7,535,233 B2 | 5/2009 | Kojovic |
| 7,567,881 B2 | 7/2009 | Kasztenny |
| 7,714,735 B2 | 5/2010 | Rockwell |
| 7,733,094 B2 | 6/2010 | Bright |
| 8,315,827 B2 | 11/2012 | Faybisovich |
| 8,410,785 B2 | 4/2013 | Calero |
| 8,502,542 B2 | 8/2013 | Couture |
| 8,525,522 B2 | 9/2013 | Gong |
| 8,598,887 B2 | 12/2013 | Bjorklund |
| 8,655,609 B2 | 2/2014 | Schweitzer |
| 8,675,327 B2 | 3/2014 | Kasztenny |
| 8,781,766 B2 | 7/2014 | Schweitzer |
| 8,990,036 B1 | 3/2015 | Schweitzer |
| 9,257,827 B2 | 2/2016 | Calero |
| 9,316,671 B2 | 4/2016 | Johannesson |
| 9,470,748 B2 | 10/2016 | Schweitzer |
| 9,594,112 B2 | 3/2017 | Schweitzer |
| 9,627,881 B2 | 4/2017 | Schweitzer |
| 9,755,673 B2 | 9/2017 | Hellmann |
| 9,941,684 B2 | 4/2018 | Calero |
| 2001/0012984 A1 | 8/2001 | Adamiak |
| 2001/0030286 A1* | 10/2001 | Egawa .................. G01Q 30/06 250/309 |
| 2002/0165462 A1 | 11/2002 | Westbrook |
| 2003/0099070 A1 | 5/2003 | Macbeth |
| 2004/0189317 A1 | 9/2004 | Borchert |
| 2004/0230387 A1 | 11/2004 | Bechhoefer |
| 2005/0151659 A1 | 7/2005 | Donovan |
| 2006/0012374 A1 | 1/2006 | Kojovic |
| 2006/0198065 A1 | 9/2006 | Guzman-Casillas |
| 2007/0041137 A1 | 2/2007 | Thompson |
| 2007/0086134 A1 | 4/2007 | Zweigle |
| 2007/0103006 A1 | 5/2007 | Zushi |
| 2008/0077336 A1 | 3/2008 | Fernandes |
| 2008/0143344 A1 | 6/2008 | Focia |
| 2008/0239602 A1 | 10/2008 | Kasztenny |
| 2009/0230974 A1 | 9/2009 | Kojovic |
| 2009/0231769 A1 | 9/2009 | Fischer |
| 2011/0058285 A1 | 3/2011 | Wibben |
| 2011/0063761 A1 | 3/2011 | Kasztenny |
| 2011/0068803 A1 | 3/2011 | Calero |
| 2011/0173496 A1 | 7/2011 | Hosek |
| 2011/0264388 A1 | 10/2011 | Gong |
| 2012/0086459 A1 | 4/2012 | Kim |
| 2012/0140365 A1* | 6/2012 | Labuschagne ........... H02H 3/16 361/47 |
| 2012/0182657 A1 | 7/2012 | Narendra |
| 2013/0021039 A1 | 1/2013 | Bjorklund |
| 2013/0096854 A1 | 4/2013 | Schweitzer |
| 2013/0100564 A1 | 4/2013 | Zhang |
| 2013/0241622 A1 | 9/2013 | Zerbe |
| 2014/0074414 A1 | 3/2014 | Schweitzer, III |
| 2014/0236502 A1 | 8/2014 | Calero |
| 2015/0160296 A1* | 6/2015 | Saarinen ........... H02J 13/00002 702/58 |
| 2015/0233976 A1 | 8/2015 | Johannesson |
| 2015/0255978 A1 | 9/2015 | Chen |
| 2016/0077149 A1 | 3/2016 | Schweitzer |
| 2016/0077150 A1 | 3/2016 | Schweitzer |
| 2016/0084893 A1 | 3/2016 | Schweitzer |
| 2016/0187406 A1 | 6/2016 | Liu |
| 2016/0266192 A1 | 9/2016 | Burek |
| 2016/0282397 A1* | 9/2016 | Kang .................... H02H 3/405 |
| 2017/0012424 A1 | 1/2017 | Schweitzer |
| 2017/0082675 A1 | 3/2017 | Schweizer |
| 2017/0117701 A1 | 4/2017 | Johannesson |
| 2017/0146613 A1 | 5/2017 | Schweitzer |
| 2017/0356965 A1 | 12/2017 | Guzman-Casillas |
| 2018/0034265 A1 | 2/2018 | Naidu |
| 2018/0083437 A1 | 3/2018 | Schweitzer, III |
| 2018/0106849 A1 | 4/2018 | Burek |

(56) References Cited

U.S. PATENT DOCUMENTS

| | | | |
|---|---|---|---|
| 2018/0136269 A1 | 5/2018 | Schweitzer, III |
| 2018/0145505 A1 | 5/2018 | Li |
| 2018/0212421 A1 | 7/2018 | Schweitzer, III |

FOREIGN PATENT DOCUMENTS

| | | |
|---|---|---|
| EP | 164711 | 12/1991 |
| EP | 244649 | 4/1992 |
| EP | 627085 | 12/2005 |
| GB | 1463755 | 2/1977 |
| WO | 9519060 | 7/1995 |
| WO | 2007135073 | 11/2007 |
| WO | 2010099585 | 9/2010 |
| WO | 2013119315 | 8/2013 |

OTHER PUBLICATIONS

Masaoki Ando, Edmund O. Schweitzer III, R. A. Baker, Development and Field-Data Evaluation of Single-End Fault Locator for Two-Terminal HVDC Transmission Lines, IEEE Transactions on Power Apparatus and Systems, vol. PAS-104, No. 12, 1985.

Masaoki Ando, Fault Location Techniques for HVDC Lines: Analysis, Development, Simulation, and Field-Data Evaluation, 1984.

P.F. Gale, Overhead Line Fault Location Based on Travelling Waves & GPS, 1993.

Harry Lee, Development of an Accurate Transmission Line Fault Locator Using the Glabal Positioning System and Satellites, 1994.

Hewlett Packard, Traveling Wave Fault Location in Power Transmission Systems, Application Note 1285, 1997.

Michael A. Street, Delivery and Application of Precise Timing for a Traveling Wave Powerline Fault Locator System, 1990.

Sergio Luiz Zimath, Marco Antonio Ramos, Jayme Silva Filho, Joaquim Moutinho Beck, Nei Mueller, Traveling Wave-Based Fault Location Experiences, 2010.

Qualitrol Corporation, Telefault TWS Traveling Wave Fault Locator, Qualitrol Brochure 2004.

Gabriel Benmouyal, Jeff Roberts, Superimposed Quantities: Their True Nature and Application in Relays, Oct. 1999.

Elhaffar, Power Transmission Line Fault Location Based on Current Traveling Waves. TKK Dissertations 107, Espoo 2008, Helsinki University of Technology. Department of Electrical Engineering, Dec. 2008.

Reason International, Inc., Traveling Wave Fault Location in Power Transmission Systems, White Paper.

Carlos Alberto Dutra, Rafael Rosar Matos, Sergio Luiz Zimath, Jurandir Paz De Oliveira, Joao Henrique Monteiro De Resende, Joaquim Americo Pinto Moutinho, Fault Location by Traveling Waves: Application in High Impedance Events.

N. Fischer, V. Skendzic, R. Moxley, J. Needs, Protective Relay Traveling Wave Fault Location, Feb. 9, 2012.

E. O. Schweitzer, III, Jeff Roberts, Distance Relay Element Design, Apr. 1993.

Fernando Calero, Distance Elements: Linking Theory with Testing, Oct. 21, 2008.

Armando Guzman, Joe Mooney, Gabriel Benmouyal, Normann Fischer, Transmission Line Protection System for Increasing Power System Requirements Apr. 8, 2002.

Borghetti, et al, "On the use of continuous-wavelet transform for fault location in distribution power systems." International Journal of Electrical Power & Energy Systems. Nov. 2006.

Maher M.I. Hashim, Hew Wooi Ping, V.K. Ramachandaramurthy, Impedance-Based Fault Location Techniques for Transmission Lines, Sep. 2009.

Zheng et al., Study on Impedance-Traveling Wave Assembled Algorithm in One-Terminal Fault Location System for Transmission Lines, Apr. 2008.

Gabriel Benmouyal, Karl Zimmerman, Experience With Subcycle Operating Time Distance Elements in Transmission Line Digital Relays, Presented at the 37th Annual Western Protective Relay Conference Oct. 2010.

Edmund O. Schweitzer, III, Armando Guzman-Casillas, Mangapathirao Venkat Mynam, Veselin Skendzic, Bogdan Kasztenny, Stephen Marx, Locating Faults by the Traveling Waves They Launch, Feb. 10, 2014.

Toshio Tahagi, Jun-Ichi Baba, Katauhiko Usmura, Tishiaki Sakaguchi, Fault Protection Based on Travelling Wave Theory—Part I Theory, Jan. 24, 1977.

Schweitzer III, Edmund O.; Kasztenny, Bogdan "Distance Protection: Why Have We Started With a Circle, Does It Matter, and What Else Is Out There?" IEEE 2018. Originally presented at the 44th Annual Western Protective Relay Conference, Oct. 2017.

He, Baina, Yunwei Zhao, and Hengxu Ha. "A Novel Wave Based Differential Protection for Distributed Parameter Line." Telkomnika Indonesian Journal of Electrical Engineering Telkomnika 11.9 (2013): 5097-104.

Tang, Lanxi; Dong, Xinzhou; Shi, Shenxing; Wang, Bin; "Travelling Wave Differential Protection Based on Equivalent Travelling Wave", 13th IET International Conference on Developments in Power System Protection (DPSP 2016), Mar. 7-10, 2016.

Solveig Ward, Comparison of Quadrilateral and Mho Distance Characteristic, Oct. 26, 1999.

Jeff Roberts, Edmund O. Schweitzer, III, Renu Aurora, Ernie Poggi, Limits to the Sensitivity of Ground Directional and Distance Protection, May 15, 1997.

Fernando Calero, Armando Guzman, Gabriel Benmouyal, Adaptive Phase and Ground Quadrilateral Distance Elements, Dec. 14, 2009.

James Hubertus, Joe Mooney, George Alexander, Application Considerations for Distance Relays on Impedance-Grounded Systems, Sep. 12, 2007.

Joe Mooney, P.E., Jackie Peer, Application Guidelines for Ground Fault Protection, 1997.

Kasztenny, Bogdan, et al. "Distance Relays and Capacitive Voltage Transformers—Balancing Speed and ransient Overreach" GE Power Management. Apr. 2000.

\* cited by examiner

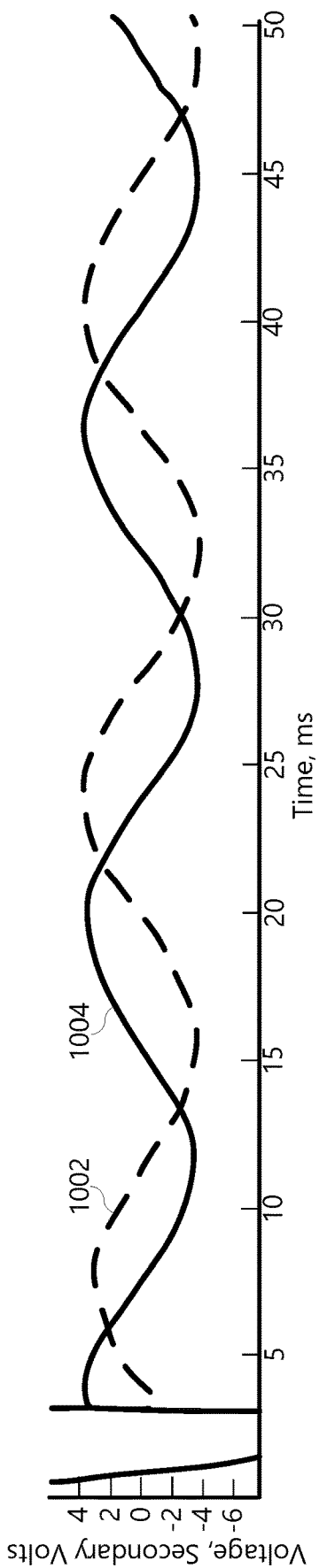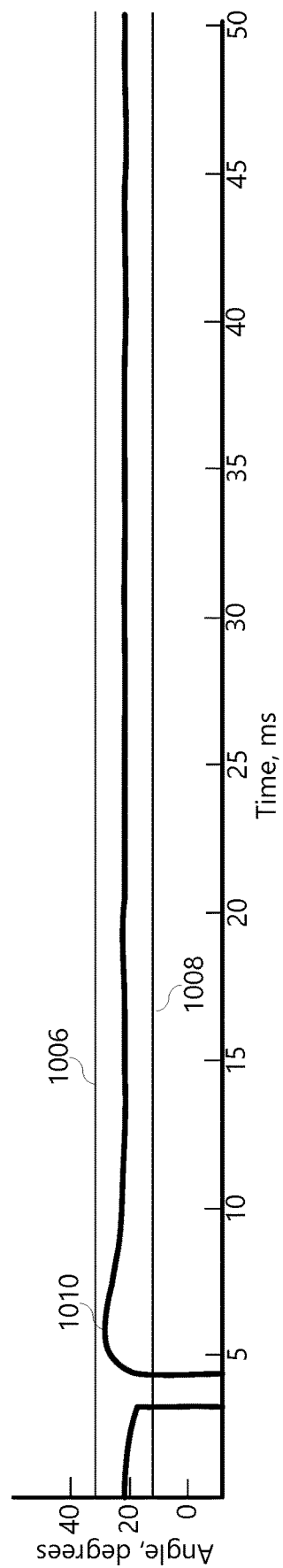
Figure 10A
Figure 10B

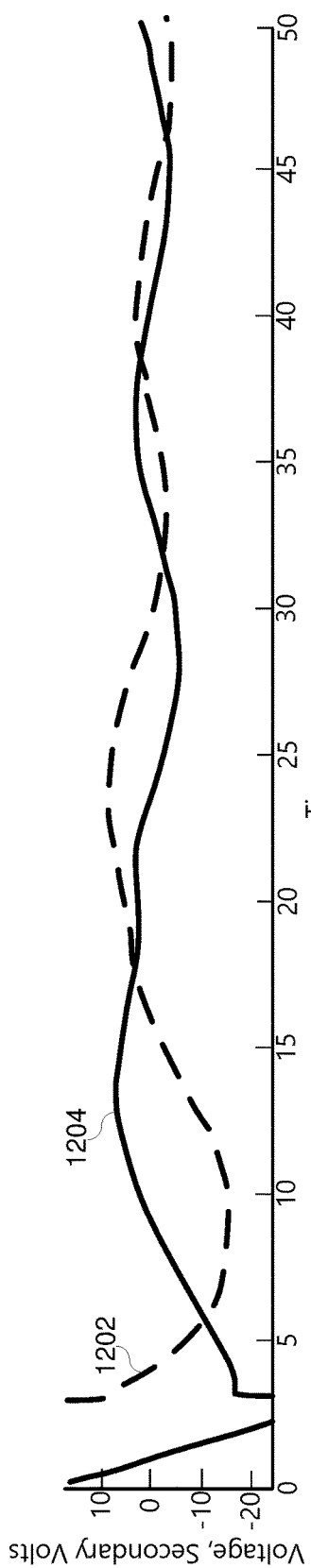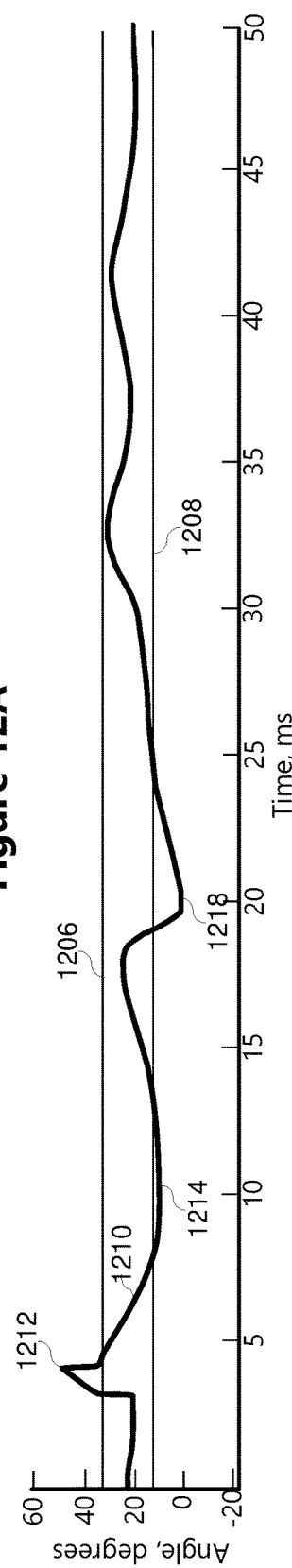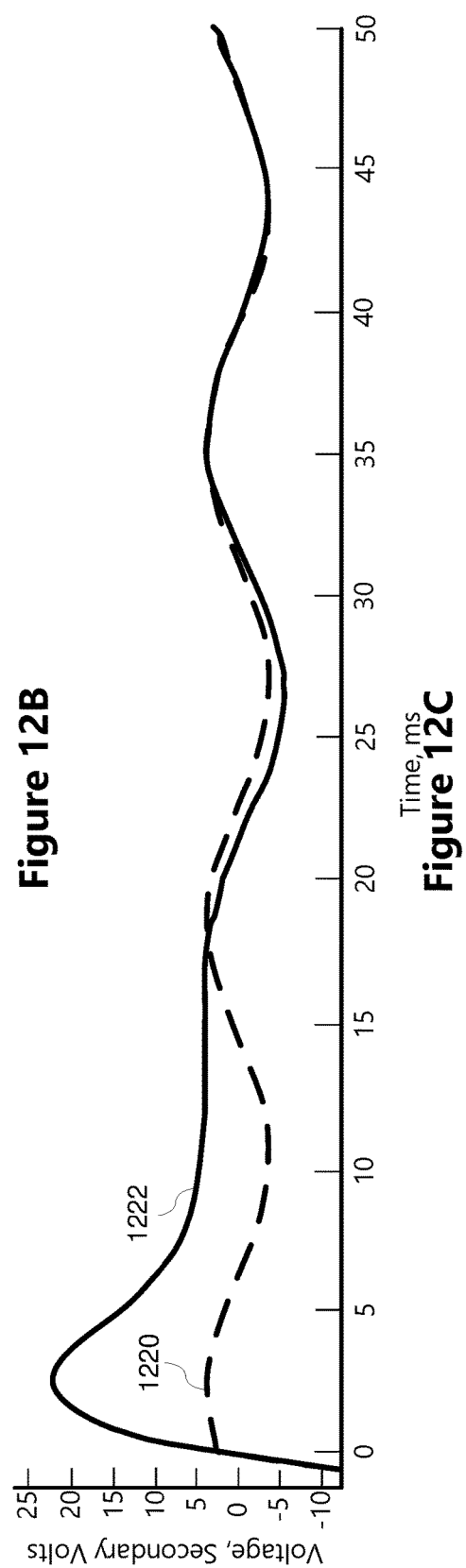

SECURE DISTANCE PROTECTION OF ELECTRIC POWER DELIVERY SYSTEMS UNDER TRANSIENT CONDITIONS

RELATED APPLICATION (none)

TECHNICAL FIELD

This disclosure relates to secure distance protection of electric power delivery systems under transient conditions. More particularly, this disclosure relates to determining if a transient condition is present, and applying additional security to the distance protection upon detection of the transient condition. The transient condition may be due to a system-impedance ratio (SIR), capacitively-coupled voltage transformer (CCVT), current transformer (CT) saturation, or the like.

BRIEF DESCRIPTION OF THE DRAWINGS

Non-limiting and non-exhaustive embodiments of the disclosure are described, including various embodiments of the disclosure with reference to the figures, in which:

FIGS. 10A and 10B illustrate plots of the real and imaginary parts of the operate signal, and the angle of advancement of the signal during a fault without a CCVT as an instrument transformer.

FIGS. 12A, 12B, and 12C illustrate plots of the real and imaginary parts of the operate signal, and the angle of advancement of the signal during a fault, with a CCVT as an instrument transformer.

DETAILED DESCRIPTION

Figure 1:
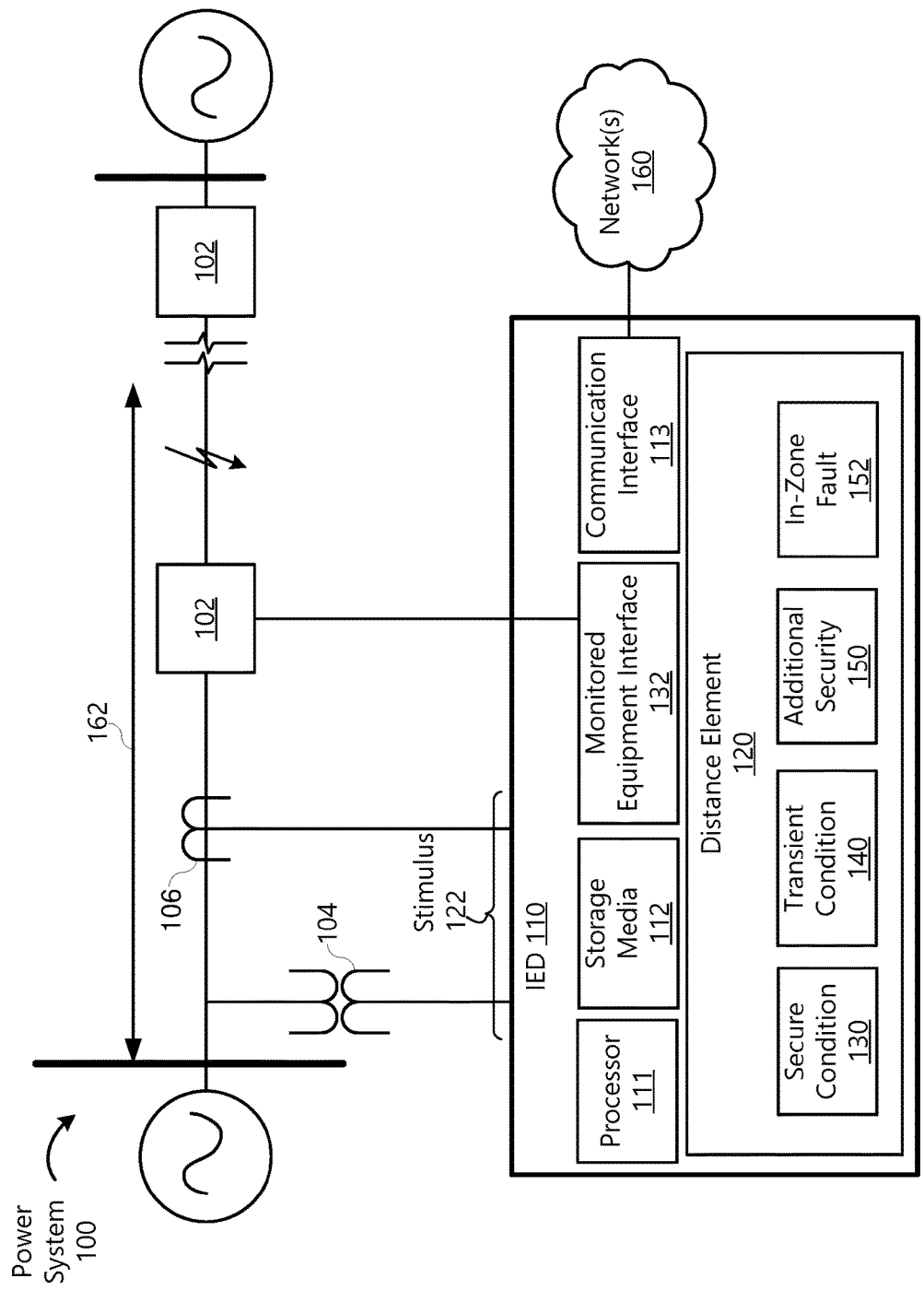
FIG. 1 illustrates a one-line diagram of an electrical power delivery system comprising an Intelligent Electronic Device (IED) implementing distance protection in accordance with several embodiments herein.

Electric power delivery systems are widely used in facilitation of generation, transmission, distribution, and consumption of electric power. Such systems include a wide variety of equipment specifically designed for the purposes of electric power delivery. Such equipment is, at times, subject to conditions outside of the specified operating parameters thereof, which may result in damage to the equipment, interruption in the generation, delivery, or consumption of electric power, or similar damages. In order to mitigate against or even avoid such conditions, electric power delivery equipment and systems of equipment are often monitored using IEDs that gather information from the equipment, determine operating conditions, and take an action if the determined operating conditions are outside of acceptable parameters.

For example, a three-phase electric power transmission line of an electric power delivery system may be used to carry electric power on separate conductors over long distances at a high voltage. The conductors are insulated from each other and the ground. A failure of the insulation may occur for multiple reasons resulting in one conductor coming into electrical contact with another conductor or the ground. Such a failure is commonly referred to as a fault. Such fault conditions may, if permitted to persist, cause further damage to the transmission line and its surroundings, including property damage and human and animal life. An IED may be used to monitor such transmission lines by obtaining electrical information from the transmission line such as, for example, voltages and currents of the transmission line. The IED may obtain the electrical information from one end of the transmission line, and may operate to detect fault conditions over a predetermined zone of the transmission line. If a fault condition is detected within the zone of protection on the transmission line, the IED may command a circuit breaker to open, removing electric power from the transmission line. Accordingly, the IED must detect the fault, and the direction to the fault, and ensure that the fault is within a distance or zone of protection using the electrical information obtained and pre-determined line parameters, before commanding the circuit breaker to open. Such monitoring in an IED by determining whether a fault is within a distance or zone of protection and commanding a circuit breaker to open may be performed using a protection element termed a "distance element".

In general, a distance element may include several logical conditions (comparators) joined with an AND gate. For example, a quadrilateral distance element includes the reactance comparator, the right blinder comparator, the left blinder comparator (optionally), the directional comparator, and the phase selection comparator. A mho distance element includes the mho comparator, the phase selection comparator, and the directional comparator. The mho element can be further modified by optionally adding the reactance comparator or the blinder comparator. Performance of all individual comparators that make up a distance element is important for the performance of the element. Further, the speed and security of a distance element is especially affected by reach-sensitive comparators, which are responsible for distinguishing between faults located short of the distance element's reach point and faults located beyond the reach point. These may be embodied as the mho comparator in the mho element, and the reactance comparator in the quadrilateral element. To some degree it may also be embodied in the blinder comparator (resistive reach comparator).

Such IEDs may determine a fault condition and conclude that the fault is within the zone of protection (i.e. between the IED and the distance element's reach point on the transmission line) using an operating signal $S_{OP}$ and a polarizing signal $S_{POL}$, which may be calculated using the measured voltage and current along with the line impedance, as illustrated in Equations 1 and 2:

$$S_{op} = I*Z_R - V \qquad \text{Eq. 1}$$

$$S_{POL} = V_{POL} \qquad \text{Eq. 2}$$

where:
I is the measured current;
V is the measured voltage;
$Z_R$ is the impedance between the location where I and V are measured and the intended reach point; and
$V_{POL}$ is a polarizing signal which may be selected from values such as: the measured voltage (a self-polarized mho); healthy phase voltage (a cross-phase polarized mho); positive-sequence voltage (a positive-sequence polarized mho); or, memorized voltage (memory polarized mho).

The voltage V and current I may be selected based on the fault type from the three-phase quantities ($V_A$, $V_B$, $V_C$, $I_A$, $I_B$, $I_C$). The fault type may be determined from among phase-to-ground loops (AG, BG, CG) and phase-to-phase loops (AB, BC, CA). Phase selection logic may be used to determine the fault type for the phase quantities to be used by the distance element. For example, the phase selection logic may permit the AG loop to operate during a phase A to ground fault. Similarly, the phase selection logic may permit the AB loop to operate during a phase A to phase B fault and a phase A to phase B to ground fault.

In yet other implementations, a reactance comparator may use the operating signal $S_{OP}$ according to Equation 1, and the polarizing signal calculated according to Equation 3:

$$S_{POL} = j*I_{POL} \qquad \text{Eq. 3}$$

where:
j denotes a phase shift by 90 degrees in frequency domain, or the di/dt operation on the polarizing current ($I_{POL}$) in time domain.

Similar to the above notation on polarization, the polarizing current $I_{POL}$ may be selected as the loop current (a self-polarized reactance), or the negative-sequence current (a negative-sequence polarized reactance) or the zero-sequence current (a zero-sequence polarized reactance), or the like.

The voltage used in the operating signal calculated as discussed above may be provided to an IED providing distance protection using an instrument transformer such as a potential transformer (PT). It should be noted that the IED may receive signals directly from the instrument transformer, or may receive the signals from another device. For example, the IED may obtain digitized analog signals from a merging unit, or even receive digitized analog signals over a communications network. In various electric power delivery systems such as, for example, high voltage and extra high voltage applications, CCVTs may be used as potential transformers to provide signals related to the voltage on the electric power delivery system. For high-voltage installations, CCVTs are cheaper than magnetic voltage transformers, and are therefore commonly used.

CCVTs have certain limitations in certain conditions where the primary voltage is not reproduced faithfully at the CCVT secondary output. In operation, CCVTs may effectively act as band-pass filters allowing only a narrow band of frequencies to pass from the primary voltage to the secondary output voltage. When the primary voltage changes (such as under fault conditions), CCVTs may generate transients, which may result from energy stored in the internal elements of the CCVT. Such transients may last for several power system cycles, have frequencies relatively close to the nominal system frequency, and may have peak magnitudes as high as 40% of the nominal voltage.

Because CCVT transients have a frequency spectrum close to the nominal frequency, it is difficult to filter such components out while passing the fundamental frequency component. The closer the frequency of the interfering signal is to the useful signal frequency, the longer it takes to separate the signals. When the IED is expected to operate quickly, a very narrow band-pass filter to separate the transients from the useful signal cannot be used due to the time such filters add to fault detection.

The magnitude of the transients, which may be as high as 40% of the nominal voltage before decaying, may result in a noise-to-signal ratio on the order of 20:1. In various distance protection elements, the polarity of the operating signal may be compared with the polarity of the polarizing signal as described above to determine if the fault is within the zone of protection or outside of the zone of protection. Noise within the signal could result in the distance element improperly concluding that the fault is within the zone of protection when it is not, or outside of the zone of protection when the fault is indeed within the zone of protection. Thus, operation of the distance protection is more secure when the operating signal does not change its sign (time domain) or angle (frequency domain) due to superimposed noise. Accordingly, what is needed is distance protection even under conditions of noise in the operating signal induced by a CCVT.

For discussions herein, the following illustrates the effect of CCVT transients on the observed voltage and the operating signal. For an error-free measurement of the current, the observed voltage V is a sum of the true voltage $V_{TRUE}$ and the transient CCVT voltage $V_{CCVT}$ as illustrated in Equation 4:

$$V = V_{TRUE} + V_{CCVT} \qquad \text{Eq. 4}$$

Thus, the operating signal is expressed in Equation 5:

$$S_{OP} = I*Z_R - V = I*Z_R - (V_{TRUE} + V_{CCVT}) = \qquad \text{Eq. 5}$$
$$I*Z_R - V_{TRUE} - V_{CCVT} = S_{OP\_TRUE} - V_{CCVT}$$

Accordingly, the operating signal is the true operating signal minus the CCVT transients.

The true operating signal, $S_{OP\_TRUE}$ can be very small, especially in systems having a high source-to-impedance ratio (SIR). Where a fault is at a distance a outside of the reach point in per-unit of reach, and under a system voltage $E = V_{NOM}$, the current at the distance protection device is observed according to Equation 6 and the voltage at the distance protection device is observed according to Equation 7:

$$I = V_{NOM}/(Z_{SYS} + (1+\alpha)*Z_R) \qquad \text{Eq. 6}$$

$$V = I*(1+\alpha)*Z_R \qquad \text{Eq. 7}$$

The true operating signal calculated using Equations 6 and 7 may be obtained using Equation 8:

$$S_{OP\_TRUE} = I*Z_R - V = -\alpha*Z_R*V_{NOM}(Z_{SYS} + (1+\alpha)*Z_R) \qquad \text{Eq. 8}$$

As described above, SIR is a ratio of the system impedance to the impedance to the reach point (SIR=$Z_{SYS}/Z_R$). The true operating signal of Equation 8 may then be expressed using Equation 9:

$$S_{OP\_TRUE} = -\alpha*V_{NOM}/(\text{SIR} + (1+\alpha)) = [-\alpha/(\text{SIR} + 1+\alpha)]*V_{NOM} \qquad \text{Eq. 9}$$

For systems with a fault 20% outside of the zone of protection ($\alpha$=0.2) under a SIR of 0.1, the true operating signal may be around 15% of the nominal voltage based on Eq. 9. For such a system, the distance protection should not assert, because the fault is outside of the zone of protection. When the CCVT transient is temporarily as high as 40% of nominal, the momentary noise-to-signal ratio of 40:15 is manageable. However, for a weaker system with an SIR of 10, the true operating signal is only around 1.8% of nominal, based on Eq. 9, resulting in a noise-to-signal ratio of 40:1.8, which presents difficulty in determining whether the fault is within the zone of protection. Indeed, distance protection may be expected to work under SIR of up to 30, which would result in a noise-to-signal ratio of 62:1.

An internal fault, such as 20% inside the zone of protection with a SIR of 30, may result in a true operating signal of around 0.65% of nominal. Note that the same system for an external fault 20% outside of the zone of protection produces a true operating signal of −0.64% of nominal. Distance protection is expected to determine this difference, restrain for the external fault, and trip for the internal fault, even when the CCVT may add 40% of the nominal to the true operating signal, while the difference in the operating signal is between 0.65% and −0.64% of nominal.

Accordingly, what is needed is distance protection that operates correctly under high SIR. Further, what is needed is distance protection that operates correctly under CCVT transient conditions.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components or elements. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor executable instructions.

FIG. 1 illustrates a one-line diagram of an electric power delivery system 100 monitored by an IED 110 that provides distance protection in accordance with several embodiments herein. As discussed above, the IED 110 may comprise and/or be implemented in conjunction with a computing device. Accordingly, the IED 110 may include a processor 111, which may comprise one or more general purpose processors, special purposes processors, application-specific integrated circuits, programmable logic elements (e.g., FPGAs), or the like. The IED 110 may further comprise non-transitory machine-readable storage media 112, which may include one or more disks, solid-state storage (e.g., Flash memory), optical media, or the like. The IED 110 may be communicatively coupled to one or more networks 160 via one or more communication interfaces 113. The networks 160 may include special-purpose networks for monitoring and/or controlling the electrical power system 100 (e.g., supervisory control and data acquisition (SCADA) networks, or the like). The networks 160 may further include general purpose communication networks, such as a TCP/IP network, or the like. The communication interface 113 may include wired and/or wireless communication interfaces (e.g., serial ports, RJ-45, IEEE 802.11 wireless network transceivers, etc.). In some embodiments, the IED 110 may include human-machine interface (HMI) components (not shown), such as a display, input devices, and so on.

The IED 110 may include a plurality of protection elements such as a distance element 120 that may be embodied as instructions stored on computer-readable media (such as storage media 112) that, when executed on the processor 111, cause the IED to detect a fault within a zone of protection. The distance element may include instructions for detecting whether distance protection security is needed 130, detecting whether a transient condition is present 140, applying additional security 150, and determining an in-zone fault 152. Upon detection of a fault within the zone of protection 162, the distance element 120 may include instructions to cause the IED to signal a circuit breaker 102 to open, removing electric power from being fed to the fault.

The IED 110 may be communicatively coupled to the power system 100 through various instrument transformers, such as, for example, current transformers 106, voltage transformers 104, and the like, where the voltage transformer may be in the form of a CCVT. That is, the IED may receive stimulus 122 from the power system 100. The stimulus 122 may be received directly via the measurement devices described above and/or indirectly via the communication interface 113 (e.g., from another IED or other monitoring device (not shown) in the electrical power system 100). The stimulus 122 may include, but is not limited to: current measurements, voltage measurements, and the like.

Furthermore, the IED 110 may include a monitored equipment interface 132 in electrical communication with a piece of monitored equipment. As illustrated, the monitored equipment interface 132 is in communication with a circuit breaker 102. The monitored equipment interface 132 may include hardware for providing a signal to the circuit breaker 102 to open and/or close in response to a command from the IED 110. For example, upon detection of a fault within the zone of protection, the distance element 120 may signal the monitored equipment interface 132 to provide an open signal to the circuit breaker 102, thus effecting a protective action on the electric power delivery system. In certain embodiments, the protective action may be effected by additional or separate devices. For example, upon detection of the fault, the distance element 120 may signal the communication interface 113, which signals other devices (using, for example, the network 160, or signaling another device directly) regarding the fault, which other devices may signal a breaker to open, thus effecting the protective action on the electric power delivery system.

The signals obtained from the electric power delivery system may be processed for use by the distance element. Currents and voltages may be sampled at a rate suitable for distance protection, such as in the order of kHz. The samples may be aligned with a time input (not shown) in some embodiments. An analog-to-digital converter (ADC) 252 may create digital representations of the incoming line current and voltage measurements. The output of the ADC may be used in various algorithms. As described above, these voltage and current signals may be used to calculate the operating and polarizing quantities as described herein.

Figure 2:
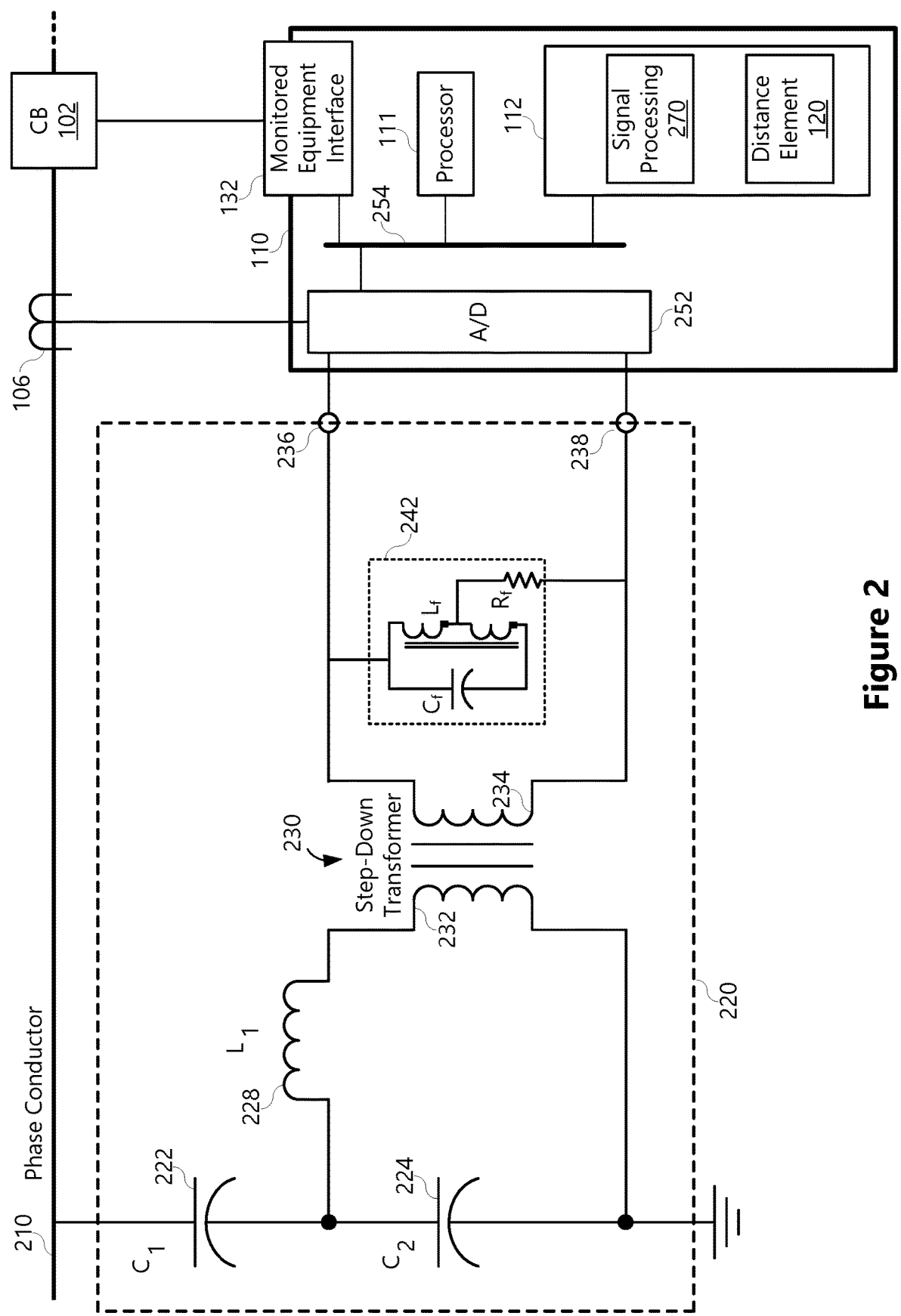
FIG. 2 illustrates a simplified one-line diagram of an IED obtaining electric power system measurements from a CCVT.

FIG. 2 illustrates a simplified block diagram of a system such as the system of FIG. 1, wherein the voltage signals are obtained using a CCVT 220 in electrical communication with a phase conductor 210. The CCVT 220 includes a step-down transformer 230 including a primary winding 232 and a secondary winding 234. The output voltage of CCVT 220 is measured across terminals 236 and 238 on secondary winding 234. As illustrated, step-down transformer 230 includes a primary capacitive assembly $C_1$ 222 and auxiliary capacitive assembly $C_2$ 224. Additionally, an inductor $L_1$ 228 may be configured to tune CCVT 220 and improve accuracy.

Primary winding 232 may be said to "tap" the junction of $C_1$ 222 and $C_2$ 224. $C_1$ 222 may couple primary winding 232 to phase conductor 210. $C_2$ 224 may couple the high-voltage side of primary winding 232 to a ground, neutral point, or neutral phase line. CCVT 220 may be used to step down high-voltage phase conductor 210 to a lower voltage across terminals 236 and 238. A ferroresonant suppression circuit (FSC) 242 may be connected to output terminals 236 and 238 to reduce or eliminate ferroresonant conditions within the CCVT 220 that may otherwise cause damaging overvoltages and/or overcurrents.

Primary capacitive assembly 222 may couple the high-voltage side of primary winding 232 to a high-voltage conductor 210. Accordingly, primary capacitive assembly 222 and auxiliary capacitive assembly 224 may be a part of a coupling-capacitor voltage divider or a capacitance-bushing voltage divider with the high-voltage side of the primary winding coupled to the "tap" of such devices. Step-down transformer 230 may step down the voltage via one or more secondary windings 234. Various desired output voltages may be achieved using any number of secondary windings and associated terminals.

The interaction of the various capacitive and reactive elements in CCVT 220 may result in transients in the secondary voltage output during switching and faults. As previously described, this transient response of CCVTs makes it difficult or impossible to accurately apply distance protection to the power system.

An IED 110 may obtain voltage signals from the CCVT using terminals 236, 238. The voltage signals and current signal (from CT 106) may be sampled and digitized using A/D converter 252. The digitized analog signals from A/D 252 may be made available to the processor 111 via bus 254. The processor 111 may obtain the power system quantities (voltages, currents, and the like), and perform functions stored on computer-readable media 112 such as, for example, signal processing 270 and distance protection using distance element 120. The signal processing 270 may include instructions that when executed by the processor 111 cause the IED 110 to determine an operating quantity, polarizing quantity, and other power system quantities for use by the distance element 120. The distance element 120 may include instructions that, when executed by the processor 111 cause the IED 110 to determine whether a fault is within the zone of protection 162, and if it is determined, implement a protective action such as signaling circuit breaker 102 to open using, for example, the monitored equipment interface 132. The distance element 120 may include instructions that determine whether additional security is needed, due to a secure operating condition or transients from a CCVT, before implementing a protective action as described in more detail herein.

Figure 3:
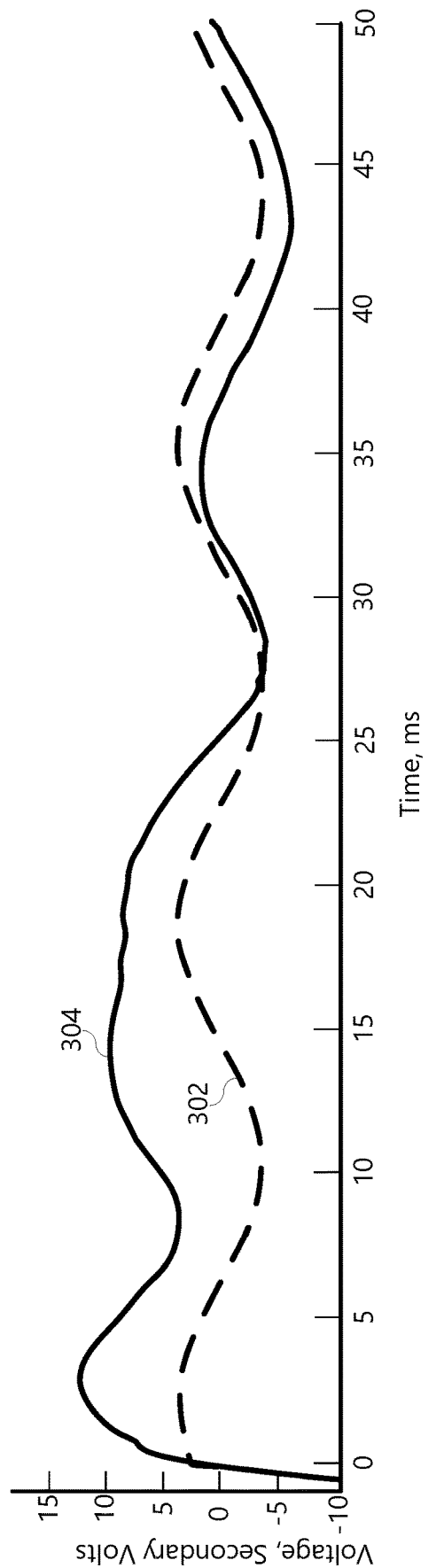
FIG. 3 illustrates a plot of a ratio voltage and a secondary output voltage from a CCVT during CCVT transient.

As stated above, instrument transformers such as CCVTs may introduce transients into power system quantities obtained by the IED. FIG. 3 illustrates a plot of voltage for a single phase over time to illustrate transient response of the CCVT during a fault at 50% of the reach of the zone of protection. Specifically, the actual system voltage (so called ratio voltage) is illustrated by trace 302, where the CCVT output voltage is illustrated by trace 304. Clearly, the CCVT output 304 includes a transient response lasting for at least 25 ms. This transient condition may result in distance protection incorrectly determining that the fault is not in the zone of protection.

To increase security of the distance protection while maintaining speed, the embodiments of this disclosure determine whether to add additional security to the distance protection or to allow the distance protection to operate normally. When no additional security is needed, the distance protection may operate as outlined above, by comparing an operating quantity to a polarizing quantity to determine if the fault is within the zone of protection, and implementing a protective action such as a trip when the fault is determined to be within the zone of protection.

Figure 4A:
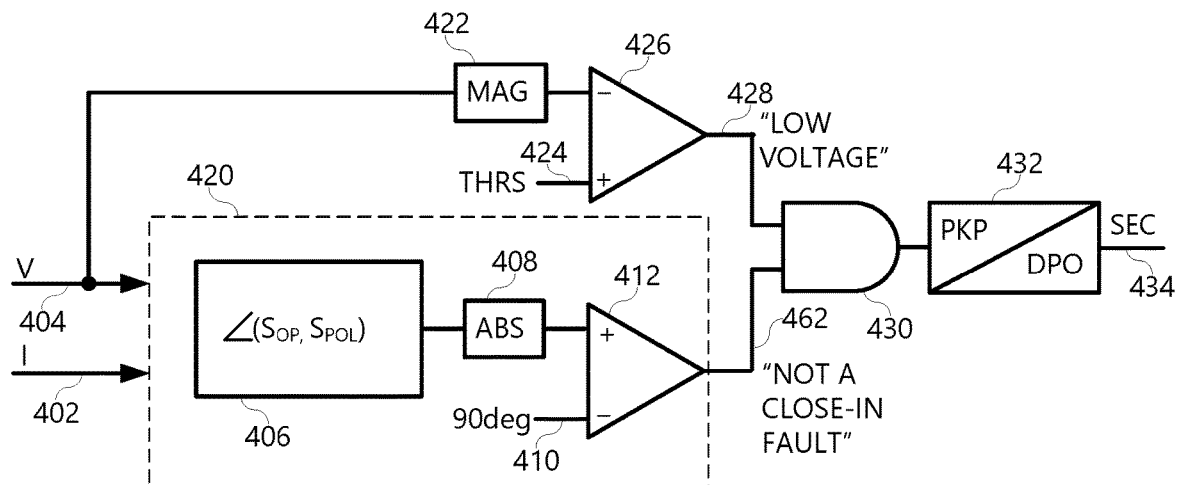
FIG. 4A illustrates a simplified block diagram of logic for determining whether additional security is needed for distance protection.

FIG. 4A illustrates a simplified block diagram of logic useful to determine whether the power system quantities obtained by the IED are sufficient for secure operation of the distance protection when operating normally. Such logic may be implemented in the secure condition instructions 130. Overall, the logic determines that additional security is needed (the distance protection operating normally would not be sufficiently secure) when the voltage magnitude is low and the fault is not a "close-in" fault. If such a condition persists for a predetermined time, then the security output indicates that additional security may be needed for the distance protection to operate securely.

Specifically, voltage 404 and current 402 are provided. As discussed in more detail above, the voltage 404 and current 402 may be digitized analog signals from an A/D originating from instrument transformers in electrical communication with the electric power delivery system. In other embodiments, the voltage 404 and current 402 may be provided over communications from another device such as, for example, a merging unit that obtains signals from instrument transformers in electrical communication with the electric power delivery system. The voltage magnitude 422 is compared against a low-voltage threshold 424. The low-voltage threshold may be a fraction of nominal voltage. In one embodiment, the low-voltage threshold may be about 40% of the nominal voltage. As noted above, CCVT transients can impact distance protection at voltages lower than 40% of nominal. However, it should be noted that the magnitude estimator 422 of the instantaneous voltage is a lagging indicator, and to detect the need for CCVT security reliably, a higher threshold may be used to detect the very low voltage condition ahead of the voltage being actually very low. If the magnitude of the voltage 422 is determined to be less than the predetermined threshold 424 in comparator 426, a "low voltage" condition 428 is determined.

In another embodiment, instead of a voltage magnitude, the comparator 426 may receive a derivative of voltage over time. If the change in voltage over time is less than a predetermined threshold (that is, the voltage is decreasing at a rate faster than a predetermined threshold), then the comparator may assert the "low voltage" signal 428.

In some embodiments, a low voltage signal may be sufficient to require additional security for operation of the distance protection. In other embodiments, it may be understood that even under a low-voltage condition, the distance protection may operate securely when the fault is sufficiently close in. Accordingly, certain embodiments may also determine whether the fault is a close-in fault before determining if the system is sufficiently secure for the distance protection to operate without additional security.

The voltage 404 and current 402 may be provided to a close-in fault calculator 420 to determine whether the fault is within the zone of protection and additional security is not needed. Several methods of determining a close-in fault may be used. As illustrated in FIG. 4A, an angle between the operating and polarizing quantities 406 is determined. Comparator 412 determines whether a magnitude 408 of the angle difference exceeds a predetermined threshold 410. The predetermined threshold for the angle difference between the operating and polarizing quantities may be around 90 degrees. If the magnitude of the angle difference exceeds the predetermined threshold, comparator 412 asserts signal 462 indicating that the fault is not a close-in fault.

If both the low-voltage condition 428 is determined and it is determined that the fault is not a close-in fault 462 in AND gate 430, then it may be determined that additional security is needed with security output 434 being asserted. In certain embodiments, the signal from AND gate 430 initiates a pickup timer 432. If the signal from AND gate 430 lasts for the pickup time, then the timer 432 asserts security output 434, indicating that additional security is needed for the distance protection. The pickup time may be on the order of 0.5 power system cycles. It may be noted that CCVT transients often do not affect security of distance protection within the first power system cycle. In these instances, if the fault is determined to be within the zone of protection within that time, then the logic of FIG. 4A would not assert, and the distance protection may operate normally without additional security. However, if the fault is determined not to be within the zone of protection, then the logic in FIG. 4A may assert as described and illustrated. The pickup timer 432 may include a dropout time to maintain assertion of the security output 434. In certain embodiments, the dropout time may be set as an expected duration of the longest possible CCVT transient plus some margin. For example, the dropout time may be around 100 ms.

Figure 4B:
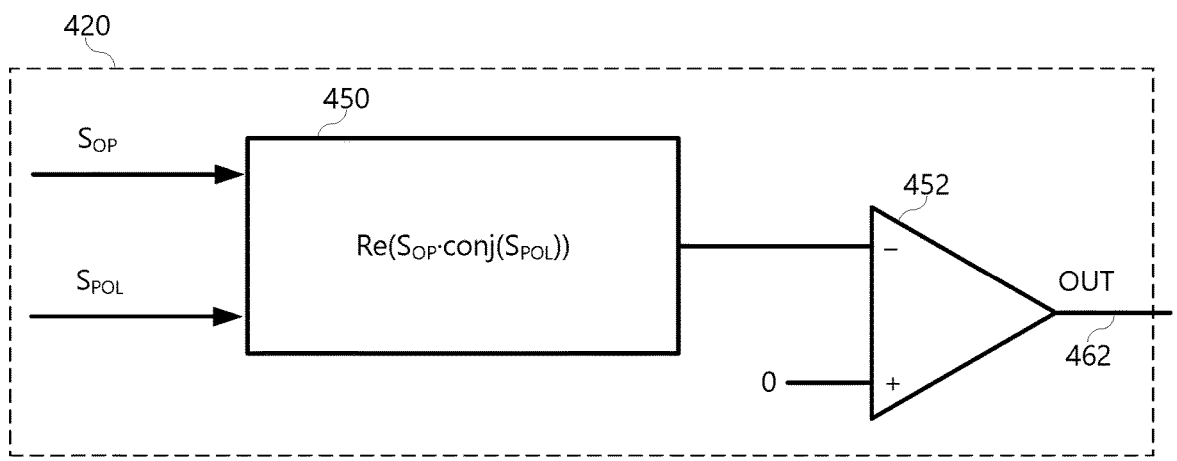
FIGS. 4B and 4C illustrate simplified block diagrams of logic for determining a close-in fault in accordance with several embodiments herein.

The close-in fault calculator 420 may use any of various methods to determine whether the fault is not a close-in fault. FIG. 4B illustrates a simplified block diagram of logic that may be used to determine that the fault is not a close-in fault 462. In the illustrated embodiment, the calculator 420 uses the operating and polarizing quantities $S_{OP}$, $S_{POL}$ in a torque calculator 450 which operates to determine a real part of the product of the operating quantity $S_{OP}$ and the complex conjugate of the polarizing quantity $S_{POL}$. A comparator 452 asserts if the output of 450 is less than zero, indicating that the polarizing and operating signals are greater than 90 deg apart.

Figure 4C:
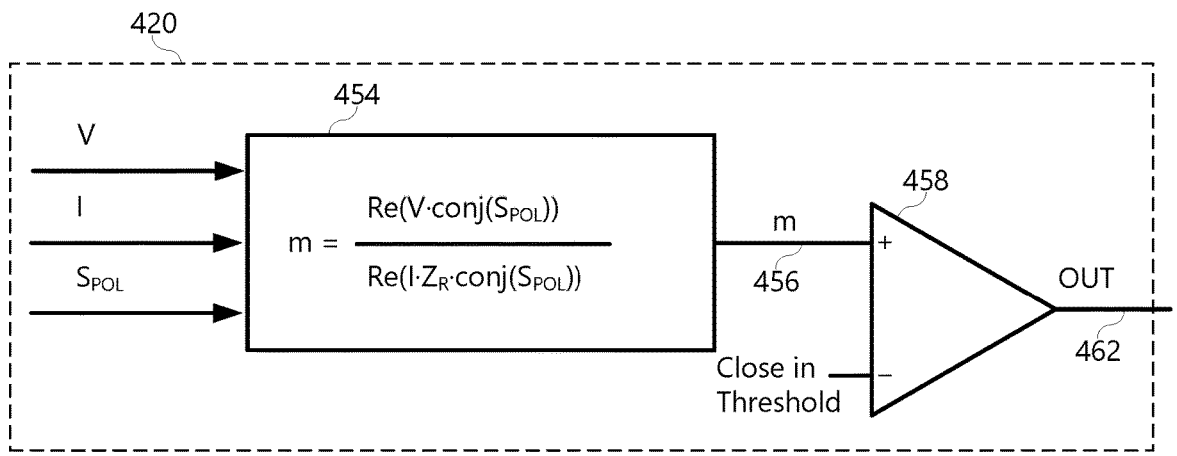

In another embodiment, as illustrated in FIG. 4C, yet another option for the calculator 420 is illustrated, but this time only applicable to the mho comparator, using voltage V, current I, reach impedance $Z_R$ as well as the polarizing signal $S_{POL}$. The voltage V and current I signals may be obtained as described above from the power system. The polarizing quantity may be any of the polarizing quantities as described above. A per-unit fault location quantity m is calculated using calculator 454 using, for example, Equation 10:

$$m = \frac{\text{Re}(V * conj(S_{POL}))}{\text{Re}(I * Z_R * conj(S_{POL}))} \qquad \text{Eq. 10}$$

As noted, the m value 456 denotes a per-unit fault location. An m-value of unity would result from a fault at the reach point. Accordingly, if the m-value according to Equation 10 is greater than a close-in threshold (which, in various embodiments, may be unity), in comparator 458, then it is determined that the fault is outside of the mho comparator zone of protection (not a close-in fault), and signal 462 is asserted. Note that the close-in threshold may be greater or less than unity. A threshold of less than unity would test for faults closer in than the reach setting of the distance protection.

In various embodiments, assertion of the security output 434 may result in additional security applied to the distance protection. In other embodiments, the security output 434 may permit additional security to be applied, when additional requirements are met.

Figure 5:
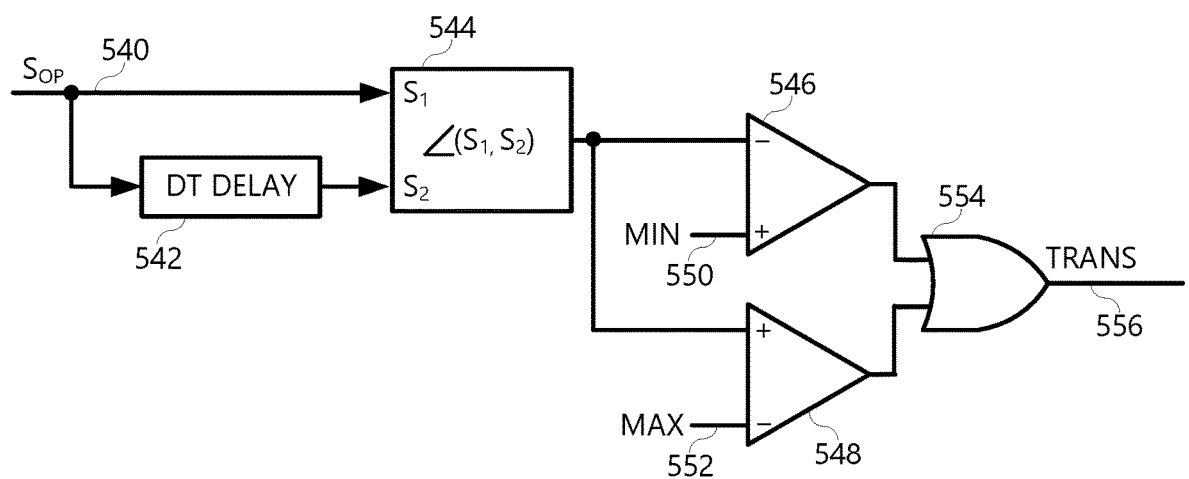
FIG. 5 illustrates a simplified block diagram for determining whether a transient condition exists.

FIG. 5 illustrates a simplified block diagram of logic for implementing certain additional requirements that must be met in addition to the security output 434 before additional security is applied to distance protection. The logic may determine a transient condition. Such logic may be implemented in the transient condition instructions 140. In certain embodiments, the logic of FIG. 5 may operate independently of the security output 434 such that the security output 434 is not needed to apply additional security to the distance protection. In other embodiments, as later discussed, both the security output and the output of the logic of FIG. 5 must be present before applying additional security to the distance protection. In sum, as illustrated, the logic determines whether a change in the operating signal is outside of a predetermined range. If so, then a transient condition is detected. It should be noted that the operating signal may be a phasor of the operating signal $S_{OP}$, a rotation of which may be monitored to determine whether a transient condition is present. If the operating signal is free of CCVT transients and other low-frequency noise, then the angle would change as illustrated in Equation 11:

$$\Delta\Phi_{NORMAL}=360 \text{ deg}*(\Delta T/PERIOD) \qquad \text{Eq. 11}$$

where:
$\Delta T$ is the time interval used to monitor for the angle change; and
PERIOD is the period of the waveform (1/frequency).

Specifically, the operating signal 540 and a delayed 542 operating signal are provided to an angle calculator 544, which calculates an angle between the operating signal 540 and the delayed 542 operating signal. The angle difference is provided to comparator 546, which asserts when the angle difference is less than a low threshold 550; and to comparator 548, which asserts when the angle difference exceeds a high threshold 552. Upon assertion of either comparator 546 or 548 into OR gate 554, the transient signal 556 is asserted.

It should be noted that the time for the time delay 542 may be related to the acceptable minimum 550 and maximum 552 thresholds. In one embodiment, the time interval to monitor for the angle change can be 1 ms. Thus, the $\Delta T$ is 1 ms. For a 60 Hz system (PERIOD=16.67 ms), the normal rate of angle change would be 360 deg*(1/16.67)=21.6 deg. A CCVT transient that is large compared with the true operating signal would change this rate very considerably. In various embodiments, the angle bounds can be set at $\pm 0.5*\Delta\Phi_{NORMAL}$. In the previous example with a time interval of 1 ms and a 60 Hz nominal frequency, the normal rate of angle change is 21.6 degrees. Accordingly, the minimum 550 threshold can be set at around 10 degrees, and maximum 552 threshold can be set at around 30 degrees. This would result in a transient detected when the rate of change of the operating signal is less than around 10 degrees per 1 ms or greater than 30 degrees per 1 ms. Thus, the acceptable range for the angle of advancement is between the minimum threshold 550 and the maximum threshold 552. The minimum and maximum thresholds 550, 552 may correspond with the power system frequency.

In various embodiments an operating signal as described above may be used to determine the rotating phasor in FIG. 5. In other embodiments, the current phasor or voltage phasor may be used as the rotating phasor to determine a transient condition in the logic of FIG. 5.

Alternative logic may be used to determine whether a rotation of a phasor is outside of a predetermined range. For example, if it is to be determined that the angle change between time t−$\Delta T$ and time t is greater than the threshold angle THA, Equation 12 may be used:

$$\text{real}(S_{op}(t)*\text{conj}(S_{op}(t-\Delta T)))>\text{mag}(S_{op}(t))*\text{mag}(S_{op}(t-\Delta T))*\cos(THA) \qquad \text{Eq. 12}$$

It should be noted that Equation 12 does not directly compute or compare the angle, but does check the rate of change of the phasor, and may be used in place of the angle check of FIG. 5 to determine a transient condition 556.

Figure 6:
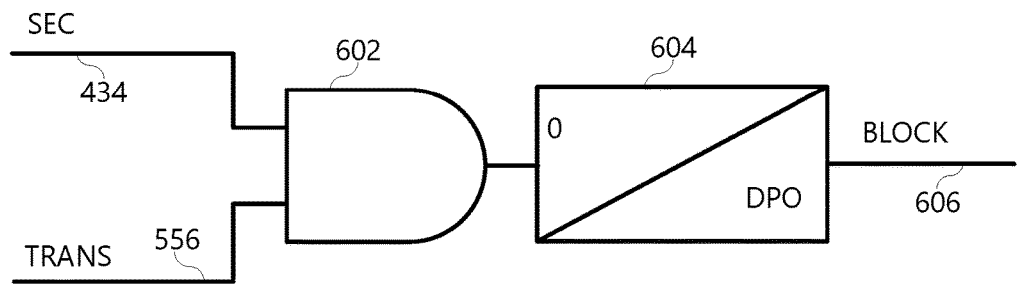
FIG. 6 illustrates a simplified block diagram of logic for distance protection applying additional security during transients.

FIG. 6 illustrates a simplified block diagram of logic that may be used to determine whether additional security is to be applied to the distance protection based on the determination of a secure condition of FIG. 4A and the transient detection of FIG. 5. Upon assertion of both the security output 434 and assertion of the transient detection signal 556, AND gate 602 asserts the block signal 606. In certain embodiments, a dropout timer 604 may be used such that the block signal 606 remains asserted for a dropout time. The dropout time may be the same as the dropout time used in FIG. 4A. That is, the dropout time can be longer than the expected transient time of the CCVT.

Figure 7:
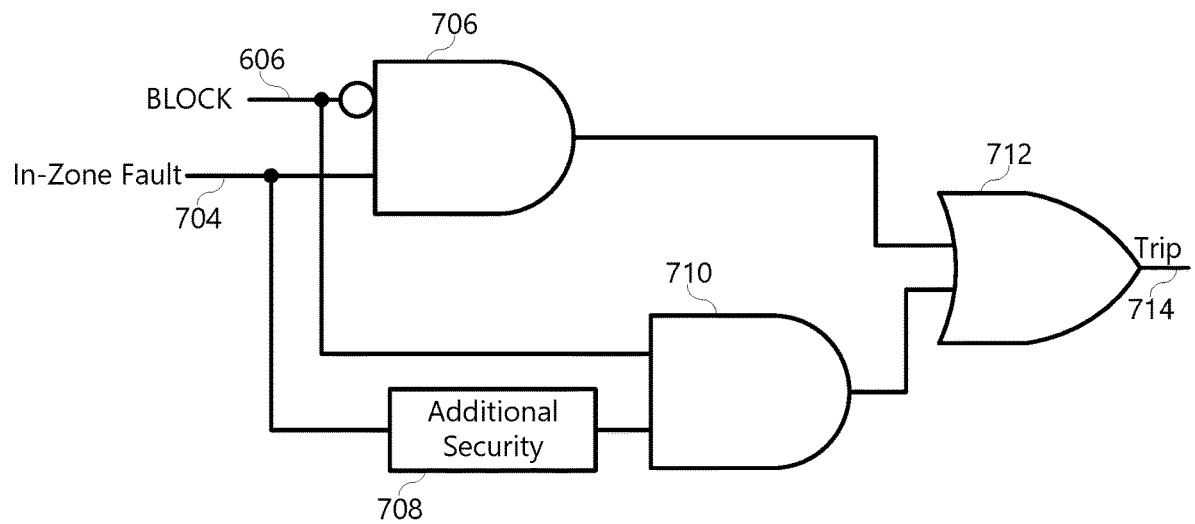
FIG. 7 illustrates a simplified block diagram of logic for applying a secure and fast distance protection in accordance with several embodiments herein.

FIG. 7 illustrates a simplified block diagram of logic useful for applying distance protection in accordance with several embodiments herein. Upon assertion of the in-zone fault detection signal 704, and the absence of the block signal 606, AND gate 706 asserts to OR gate 712 to assert the trip signal 714. Accordingly, when the system does not detect the transient condition (FIG. 5) or does not determine that additional security is needed (FIGS. 4A-4C), then the distance protection is allowed to operate normally with no additional security. However, upon assertion of the block signal 606, AND gate 706 does not assert. Instead, additional security 708 is applied to the distance protection. If, after application of the additional security an in-zone fault is determined and the block signal 606 persists, then AND gate 710 asserts to OR gate 712, yielding the trip signal 714. Additional security may be implemented as an extra time delay, reduction in the distance element reach, a combination of the two measures, and the like. Accordingly, additional security is only applied to the distance protection if the system determines that security is needed and a transient condition exists, resulting in secure distance protection when needed. An "in-zone" fault 704 is determined when the distance protection determines that the fault is within the zone of protection.

Figure 8A:
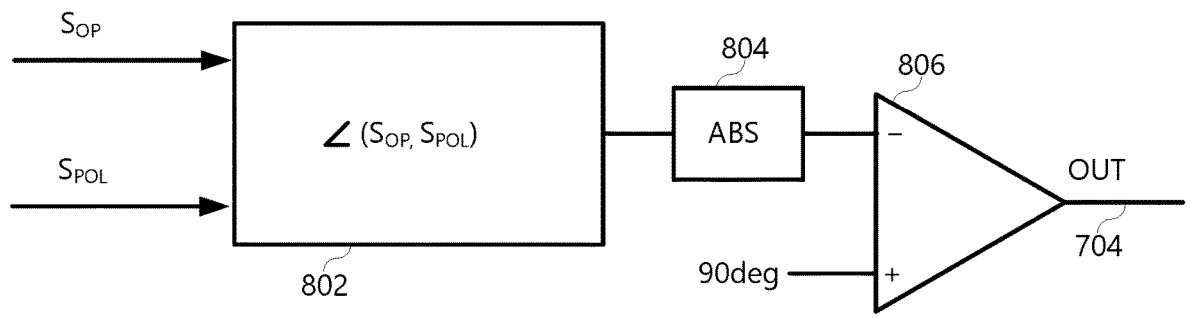
FIGS. 8A, 8B, and 8C illustrate simplified block diagrams for determining whether a fault is within a zone of protection.
Figure 8B:
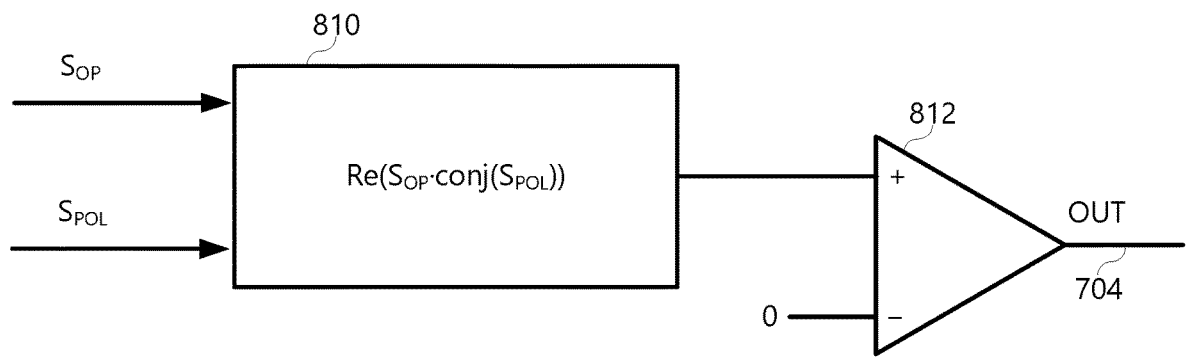
Figure 8C:
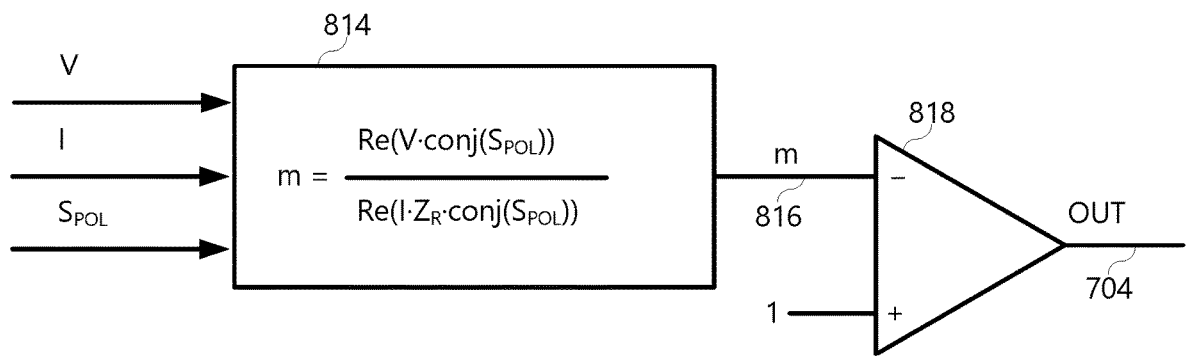

A fault within the zone of protection may be determined using various different distance protection methods. The in-zone fault detection may be implemented in the in-zone fault instructions 152. FIGS. 8A, 8B, and 8C illustrate three different methods to determine whether a fault is within a zone of protection, although other distance protection methods may be used. Generally, these embodiments will output a signal 704 upon determination that the fault is within the zone of protection, evidenced by the polarizing and operating signals being in phase.

The embodiment illustrated in FIG. 8A uses the operating and polarizing quantities $S_{OP}$, $S_{POL}$ in a direct angle calculator 802 which calculates an angle between the operating and polarizing quantities $S_{OP}$, $S_{POL}$. In some embodiments, the operating and polarizing quantities $S_{OP}$, $S_{POL}$ such as those calculated using Equations 1, 2, and 4 may be used. An absolute value of the angle is determined 804 and compared against a predetermined angle threshold such as, for example, 90 degrees in comparator 806. When the angle is less than the predetermined threshold, then the comparator 806 asserts signal 704 indicating that the polarizing and operating signals are less than 90 deg apart.

The comparator of FIG. 8B uses the operating and polarizing quantities $S_{OP}$, $S_{POL}$ in a torque calculator 810 which operates to determine a real part of the product of the operating quantity $S_{OP}$ and the complex conjugate of the polarizing quantity $S_{POL}$. A comparator 812 asserts if the output of the calculator is greater than zero, indicating that the polarizing and operating signals are less than 90 deg apart.

FIG. 8C illustrates yet another option for the frequency-domain comparator, but this time only applicable to the mho comparator, using voltage V, current I, reach impedance $Z_R$ as well as the polarizing signal $S_{POL}$. The voltage V and current I signals may be obtained as described above from the power system. The polarizing quantity may be any of the polarizing quantities as described above. A per-unit fault location quantity m is calculated using calculator 814 using, for example, Equation 13:

$$m = \frac{\text{Re}(V * conj(S_{POL}))}{\text{Re}(I * Z_R * conj(S_{POL}))} \quad \text{Eq. 13}$$

As noted, the m-value denotes a per-unit fault location. An m-value of unity would result from a fault at the reach point. According to the illustrated embodiment, if the m-value according to Equation 13 is less than unity, in comparator 818, then it is determined that the fault is within the mho comparator zone of protection, and signal 704 is asserted.

Returning now to the additional security 708 to be applied upon detection of a condition resulting in a security output 434 and the transient condition 556, several different additional security measures may be implemented. Such logic for applying additional security may be implemented in the additional security instructions 150. In one embodiment, a time delay is added to the distance protection before the trip command may be given. The time delay may be sufficiently long such that the distance protection does not assert until after the CCVT transient has passed. If the measurements from the electric power delivery system after the time delay has passed result in the distance protection determination that the fault is within a zone of protection, then the trip command may be issued.

In another embodiment, the applied additional security may be reduction of the reach of the zone of protection. As illustrated in FIG. 1, a reach of the zone of protection 162 may refer to a certain portion of the electric power delivery system within which the distance protection may operate. Reducing the reach of the zone of protection gives more margin for the CCVT caused transient overreach. The reduced zone of protection may be undertaken by reducing the $Z_R$ parameter in the above equations. If the fault is determined to be within the reduced zone of protection, then the distance protection may issue a trip command.

In another embodiment, a multiple reach may be implemented within the zone of protection. A short reach with no time delay may cover a reduced portion of the zone of protection, while a time delay may be implemented for faults determined to be within the zone of protection but outside of the short reach. As with the various embodiments above, this time delay may be related to the expected transient time of the CCVT.

In another embodiment, the applied additional security may be implemented by applying a numerical filter to the voltage signal from the CCVT. In one embodiment, the numerical filter may include a first stage and a second stage. The numerical filter may result in a delay of operation of the distance protection.

In another embodiment, the additional security may be implemented by monitoring a parameter of the distance to the fault for smoothness. Smoothness may refer to a stabilization time needed for the calculated parameter to return to a stable value. For example, where the in-zone fault is determined using the m-value as illustrated in FIG. 8C, the m-value may be monitored for smoothness. Where the m-value is sufficiently smooth, then the distance protection may operate to issue a trip command when it is determined that the fault is within the zone of protection. Smoothness may be determined by monitoring a change of the m-value. If the m-value changes less than a predetermined range for a predetermined time, then the m-value may be determined to be smooth and useful for distance protection. In some embodiments, the predetermined time may be related to the time of expected transients of a CCVT.

In another embodiment, the additional security may be implemented by applying a numerical filter tuned to the specific CCVT used to obtain the voltage signal. The filter may be tuned by emulating an inverted transfer function of the specific CCVT. Parameters of the specific CCVT must be known to implement this filter.

In another embodiment, the additional security may be implemented by simply blocking the distance protection while both of the security output 434 and the transient condition 556 are present. Alternatively, once the block signal 606 is asserted, the additional security may be to simply block the distance protection until the transient condition 556 is no longer detected, regardless of assertion of the security output 434.

Figure 9:
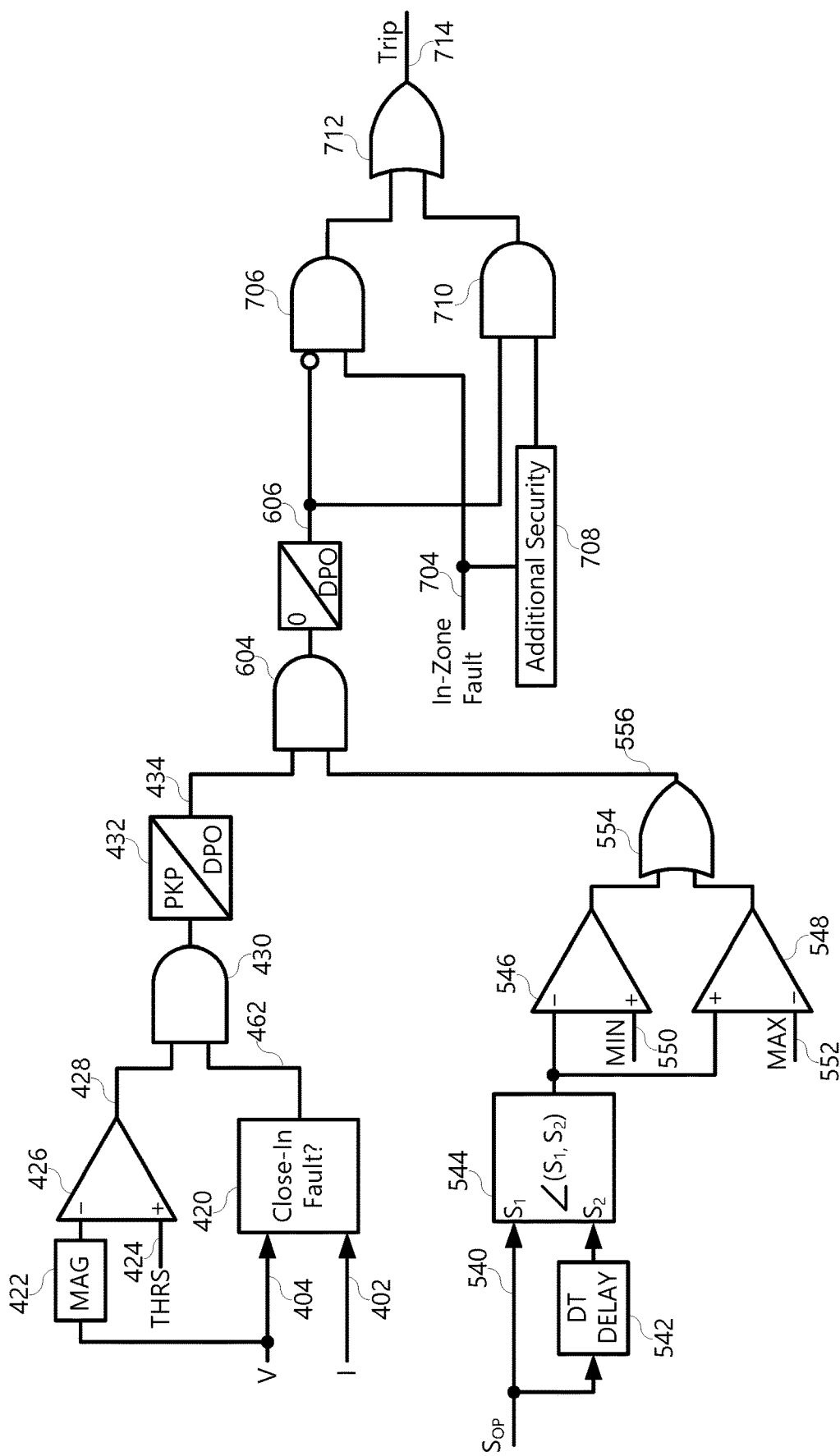
FIG. 9 illustrates a simplified block diagram of logic for applying a secure and fast distance protection in accordance with several embodiments herein.

FIG. 9 illustrates a simplified block diagram of logic that may be used to apply distance protection with speed and additional security, when necessary, according to the several embodiments herein. The distance protection may be executed by a processor 111 of an IED, and stored on computer-readable storage media 112 as a distance element 120. Voltages and currents may be obtained and used to determine whether additional security is needed based on voltage magnitude 422 falling below a predetermined threshold and a fault not being a close-in fault 420. A rate of change of an angle between the operating signal and a past operating signal may be compared against a predetermined range to determine a transient condition 556. Additional security 708 may be applied to the distance protection when both the insecure condition is detected (asserting security output 434) and the transient condition is detected 556. A protective action such as a trip 714 may be taken when the fault is determined to be within a zone of protection and either a block signal is not present or a block signal is present and the fault is determined to be within the zone of protection when additional security is applied.

FIGS. 10A and 10B illustrate plots of the real 1004 and imaginary 1002 parts of the operating signal and the angle of advancement of the operating signal 1010 during an A-phase-to-ground fault at 50% of the reach in the zone of protection under a SIR of 10. It should be noted that a transient is not readily observed, and the angle of advancement of the operating signal 1010 quickly resolves to be within the upper 1006 and lower 1008 bounds. Accordingly, no additional security is needed, and the distance protection of the present embodiments operate quickly and securely.

Figure 11A:
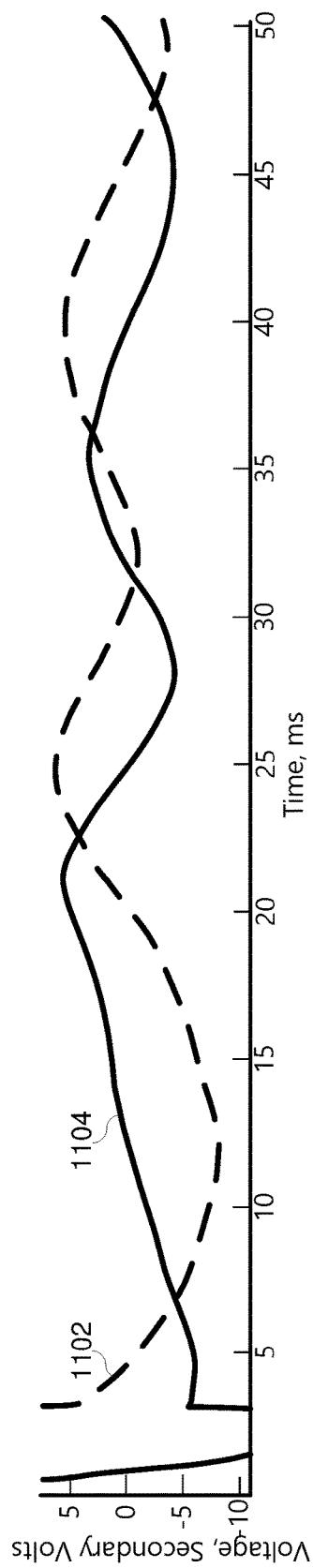
FIGS. 11A, 11B, and 11C illustrate plots of the real and imaginary parts of the operate signal, and the angle of advancement of the signal during the same fault as illustrated in FIGS. 10A and 10B, with a CCVT as an instrument transformer.
Figure 11B:
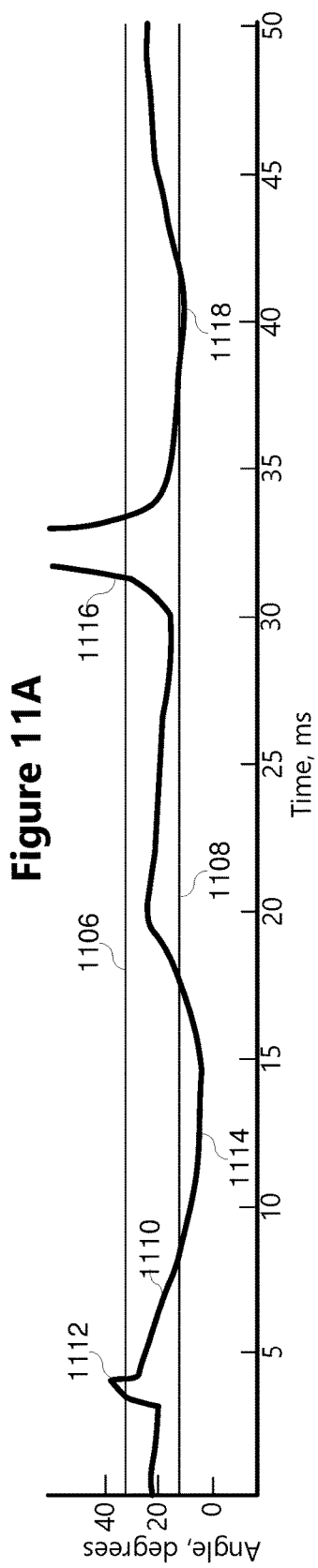
Figure 11C:
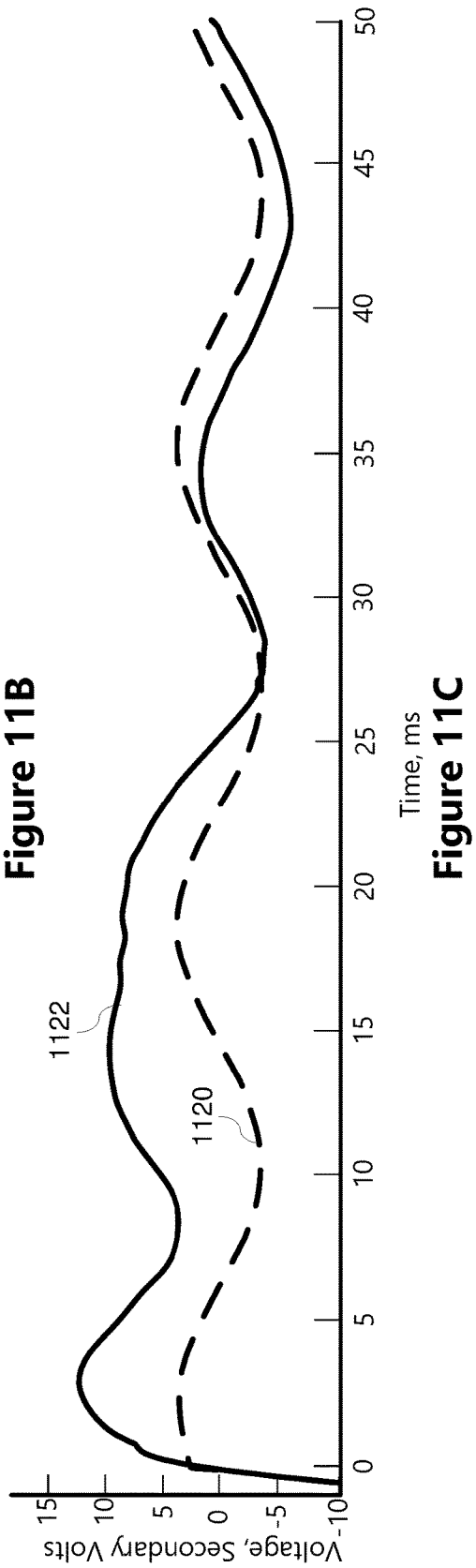

FIGS. 11A and 11B illustrate plots of the real 1104 and imaginary 1102 parts of the operating signal and the angle of advancement of the operating signal 1110 under the same fault conditions as applied to the example illustrated in FIGS. 10A and 10B, but with the instrument transformer providing the voltage signal being a CCVT. It is observed that the angle of advancement of the operating signal 1110 exits the upper 1106 and lower 1108 bounds of the acceptable range at 1112, 1114, 1116, and 1118, over more than 40 ms during the fault condition. FIG. 11C illustrates a plot of the actual A-phase-to-ground voltage 1120 and the output voltage signal 1122 from the CCVT. The transient condition is clearly observed. The embodiments herein apply additional security measures as described herein before the distance protection may output a trip signal.

FIGS. 12A and 12B illustrate plots of the real 1204 and imaginary 1202 parts of the operating signal and the angle of advancement of the operating signal 1210 under the same fault conditions as applied to the example illustrated in FIGS. 11A and 11B, but with a different CCVT than the one used in the experiment previously illustrated. It is observed that the angle of advancement of the operating signal 1210 exits the upper 1206 and lower 1208 bounds of the acceptable range at 1212, 1214, and 1218, over more than 20 ms during the fault condition. FIG. 12C illustrates a plot of the actual A-phase-to-ground voltage 1220 and the output voltage signal 1222 from the CCVT. The transient condition is clearly observed. The embodiments herein apply additional security measures as described herein before the distance protection may output a trip signal.

Figure 13A:
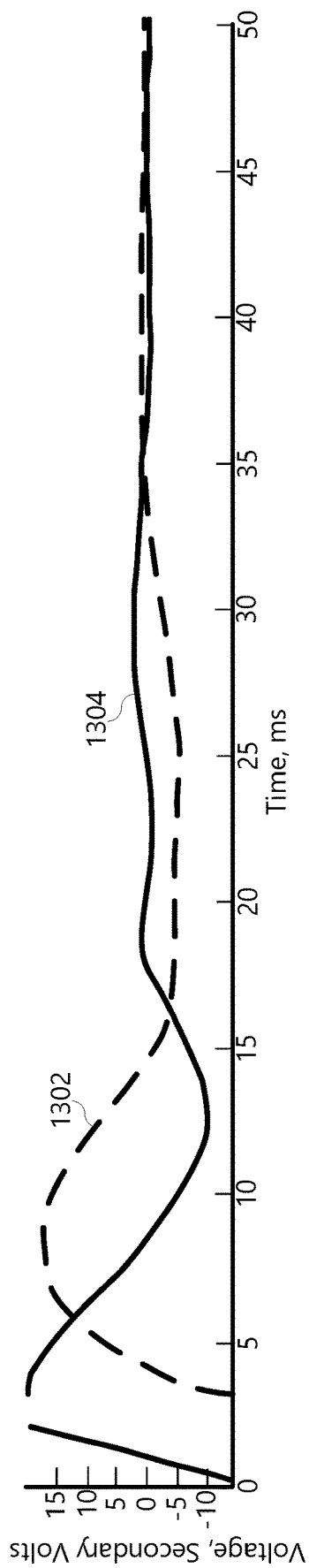
FIGS. 13A and 13B illustrate plots of the real and imaginary parts of the operate signal, and the angle of advancement of the signal during a fault, with a CCVT as an instrument transformer.
Figure 13B:
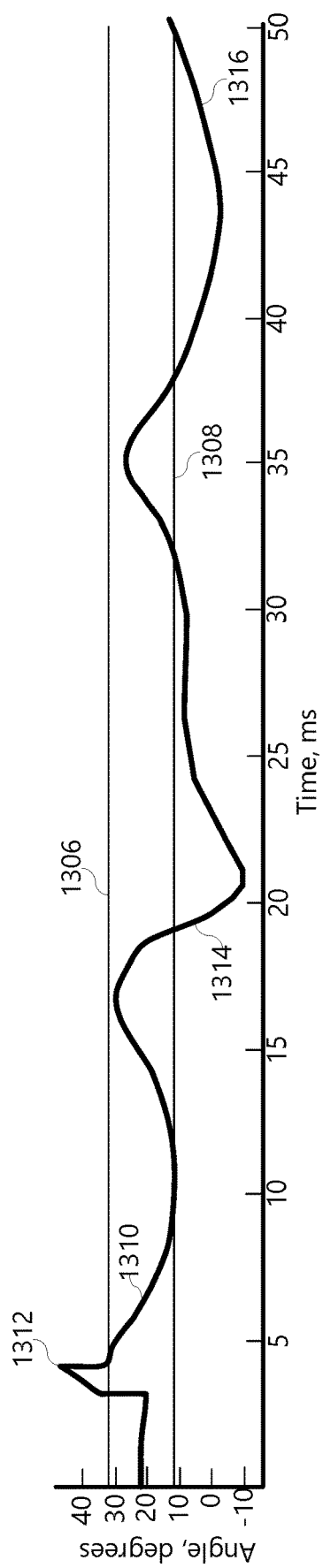

In yet another trial, FIGS. 13A and 13B illustrate plots of the real 1304 and imaginary 1302 parts of the operating signal and the angle of advancement of the operating signal 1310 under fault conditions at 96% of the reach of the zone of protection with an SIR of 10. It is observed that the angle of advancement of the operating signal 1310 exits the upper 1306 and lower 1308 bounds of the acceptable range at 1312, 1314, and 1316, over at least 50 ms during the fault condition. The embodiments herein apply additional security measures as described herein before the distance protection may output a trip signal.

While specific embodiments and applications of the disclosure have been illustrated and described, it is to be understood that the disclosure is not limited to the precise configurations and components disclosed herein. Moreover, principles described herein may also be utilized for protecting an electric system from over-frequency conditions, wherein power generation would be shed rather than load to reduce effects on the system. Accordingly, many changes may be made to the details of the above-described embodiments without departing from the underlying principles of this disclosure. The scope of the present invention should, therefore, be determined only by the following claims.

What is claimed is:

1. A system to determine a fault within a first zone of protection of an electric power delivery system, comprising:
   a signal processing subsystem to power system quantities related to voltages and currents from the electric power delivery system;
   a distance protection subsystem in communication with the signal processing subsystem, to:
      estimate a location of the fault within the first zone of protection;
      determine an operating signal from the power system quantities;
      determine an angle of advancement of the operating signal;
      when the angle of advancement is outside of a predetermined range, apply additional security; and
      determine a location of the fault within the first zone of protection using the power system quantities and applied additional security; and
   a protective action subsystem in communication with the distance protection subsystem to implement a protective action based on the determination of the location of the fault within the first zone of protection.

2. The system of claim 1, wherein the distance protection subsystem applies additional security when both:
   the angle of advancement is outside of the predetermined range; and,
   for a predetermined time:
      the estimated location of the fault is not within a close-in fault zone; and,
      a voltage quantity of the power system quantities is below a predetermined threshold.

3. The system of claim 2, wherein the voltage quantity comprises a voltage magnitude.

4. The system of claim 2, wherein the voltage quantity comprises a rate of change of voltage.

5. The system of claim 2, wherein the close-in fault zone comprises the first zone of protection.

6. The system of claim 1, wherein the power system quantities comprise voltage quantities and current quantities.

7. The system of claim 1, wherein the predetermined threshold for the angle of advancement comprises a range corresponding with power system frequency.

8. The system of claim 1, wherein the electric power system signal processing system obtains electric power system voltages from a capacitively-coupled current transformer (CCVT) of the electric power delivery system.

9. The system of claim 8, wherein the predetermined threshold for the angle of advancement comprises a range corresponding with transients induced by the CCVT.

10. The system of claim 1, wherein the operating signal comprises a current phasor calculated from the power system quantities.

11. The system of claim 1, wherein the operating signal comprises a voltage phasor calculated from the power system quantities.

12. The system of claim 1, wherein the operating signal comprises a combination of voltage and current from the power system quantities.

13. The system of claim 1, wherein the additional security comprises a time delay.

14. The system of claim 1, wherein the additional security comprises reducing the first zone of protection.

15. The system of claim 1, wherein the additional security comprises applying a secure zone of protection, shorter than the first zone of protection.

16. The system of claim 1, wherein the additional security comprises determining a smoothness of the determined location of the fault and comparing the smoothness against a smoothness threshold.

17. A method to determine a fault within a first zone of protection of an electric power delivery system, comprising:
   an intelligent electronic device in communication with the electric power delivery system estimating a location of the fault within the first zone of protection using power system quantities from the electric power delivery system;
   determining an operating signal from the power system quantities;
   determining an angle of advancement of the operating signal;
   when the angle of advancement is outside of a predetermined range, applying additional security;

determining a location of the fault within the first zone of protection using the power system quantities and applied additional security; and effecting a protective action on the electric power delivery system based on the determination of the location of the fault within the first zone of protection.

18. The method of claim 17, further comprising determining whether the estimated location of the fault is within a close-in fault zone;

comparing a voltage quantity of the power system quantities against a predetermined threshold; and wherein the additional security is applied when the angle of advancement is outside of the predetermined range and for a predetermined time the estimated location of the fault is not within the close-in fault zone and the voltage quantity is below the predetermined threshold.

19. The method of claim 17, wherein the electric power delivery system comprises a capacitively-coupled current transformer (CCVT) and a voltage quantity of the power system quantities is obtained using an output of the CCVT.

20. The method of claim 19, wherein the predetermined threshold for the angle of advancement comprises a range corresponding with transients induced by the CCVT.

* * * * *